(12) United States Patent
Oota et al.

(10) Patent No.: US 9,709,887 B2
(45) Date of Patent: Jul. 18, 2017

(54) PHOTOSENSITIVE CONDUCTIVE FILM

(71) Applicant: HITACHI CHEMICAL COMPANY, LTD., Tokyo (JP)

(72) Inventors: Emiko Oota, Tokyo (JP); Masahiko Ebihara, Tokyo (JP); Yasuharu Murakami, Tokyo (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 0 days.

(21) Appl. No.: 15/125,879

(22) PCT Filed: Mar. 9, 2015

(86) PCT No.: PCT/JP2015/056832
§ 371 (c)(1),
(2) Date: Sep. 13, 2016

(87) PCT Pub. No.: WO2015/137278
PCT Pub. Date: Sep. 17, 2015

(65) Prior Publication Data
US 2017/0003588 A1    Jan. 5, 2017

(30) Foreign Application Priority Data

Mar. 14, 2014 (JP) ................................. 2014-051702

(51) Int. Cl.
*G03F 7/027* (2006.01)
*G03F 7/004* (2006.01)
(Continued)

(52) U.S. Cl.
CPC ............ *G03F 7/0047* (2013.01); *G03F 7/027* (2013.01); *G03F 7/031* (2013.01); *G03F 7/033* (2013.01);
(Continued)

(58) Field of Classification Search
CPC ...... G03F 7/0005; G03F 7/0047; G03F 7/027; G03F 7/031; G03F 7/033; G06F 3/044; G06F 2203/04103
(Continued)

(56) References Cited

U.S. PATENT DOCUMENTS

2012/0027994 A1*  2/2012  Takada .................... B32B 7/12
                                                      428/141
2012/0088189 A1*  4/2012  Miyagishima ......... B82Y 30/00
                                                      430/280.1

FOREIGN PATENT DOCUMENTS

JP    2008-126469 A    6/2008
JP    2009-505358 A    2/2009
(Continued)

OTHER PUBLICATIONS

Computer-generated translation of JP 2012-169072 (Sep. 2012).*
(Continued)

*Primary Examiner* — John A McPherson
(74) *Attorney, Agent, or Firm* — Fitch, Even, Tabin & Flannery, LLP

(57) ABSTRACT

A photosensitive conductive film includes: a support film; and a photosensitive layer which is provided on the support film, wherein the photosensitive layer contains a plurality of conductive fibers, and an average value of the shortest distances between each of the conductive fibers and the surface at the side of the support film of the photosensitive layer is 0.1 to 50 nm.

8 Claims, 11 Drawing Sheets

(51) Int. Cl.
G03F 7/031 (2006.01)
G03F 7/033 (2006.01)
G06F 3/044 (2006.01)

(52) U.S. Cl.
CPC .... G06F 3/044 (2013.01); *G06F 2203/04103* (2013.01)

(58) Field of Classification Search
USPC ................................ 430/270.1, 281.1, 321
See application file for complete search history.

(56) References Cited

FOREIGN PATENT DOCUMENTS

| JP | 2012-169072 A | * | 9/2012 |
|----|---------------|---|--------|
| NO | 2007/022226 A2 | | 2/2007 |
| WO | 2010/021224 A1 | | 2/2010 |
| WO | 2012/133367 A1 | | 10/2012 |
| WO | 2013/051516 A1 | | 4/2013 |

OTHER PUBLICATIONS

International Preliminary Report on Patentability of Counterpart Appln. No. WO PCT/JP2015/056832 dated Oct. 4, 2016 in English.
International Search Report for PCT/JP2015/056832 mailed May 19, 2015; English translation submitted herewith (5 pages).

* cited by examiner (a)

(b)

(c)

(a)

(b)

(c)

(d)

PHOTOSENSITIVE CONDUCTIVE FILM

TECHNICAL FIELD

The present invention relates to a photosensitive conductive film, and relates particularly to a photosensitive conductive film which is used in a flat panel display, a touch screen, a solar battery and the like.

BACKGROUND ART

A touch panel, for instance, is used in: large-sized electronic equipment such as a personal computer and a television; small-sized electronic equipment such as a car navigation system, a mobile phone, a portable music player and an electronic dictionary; and display equipment such as OA/FA equipment.

Various types of touch panels have been already practically used, but in recent years, a capacitance-type touch panel has been progressively used. In the capacitance-type touch panel, when a fingertip (conductor) comes in contact with a touch input surface, an electrostatic capacitive coupling occurs between the fingertip and a transparent electrode (transparent conductive film or the like), and a capacitor is formed. The capacitance-type touch panel catches the change of electric charges at the contact positions with the fingertip, and thereby detects its coordinate.

In particular, a projection capacitance type touch panel can detect multiple points of the fingertip, and accordingly has such adequate operability as to be capable of giving a complicated direction. For this reason, the projection capacitance type touch panel has been progressively used as an input device on a display surface in equipment (mobile phone, portable music player and the like) having a small-sized display device, because of the adequate operability.

Generally, in the projection capacitance type touch panel, a plurality of X-electrodes and a plurality of Y-electrodes which are perpendicular to the X-electrodes form a double-layer structure, so as to embody two-dimensional coordinates formed of an X-axis and a Y-axis. A transparent conductive film, for instance, is used for the above-described electrodes.

Conventionally, ITO (Indium-Tin-Oxide), indium oxide, tin oxide and the like are used as a constituent material for the transparent conductive film, because of having high transmissivity for visible light, but in recent years, such a trial has been performed as to form a transparent conductive pattern by using an alternative material for the above materials. For instance, the following Patent Literature 1 proposes a forming method of a conductive pattern using a photosensitive conductive film having a conductive layer containing a conductive fiber.

In addition, the following Patent Literature 2 proposes a method of forming conductive pattern by laminating a photosensitive conductive film on a substrate, performing an exposure step twice, and subsequently performing development.

CITATION LIST

Patent Literature

Patent Literature 1: International Publication No. WO 2010/021224

Patent Literature 2: International Publication No. WO 2013/051516

SUMMARY OF INVENTION

Technical Problem

By the way, a wiring circuit for transmitting the electric change, which has occurred in a transparent electrode portion, to a control IC is formed in a frame region at the periphery of the touch panel. Examples of such wiring circuits include: a wiring circuit which has been formed by printing a wiring circuit pattern by screen printing with the use of a thermosetting type or an evaporation drying type of silver paste, and then performing heat treatment; a wiring circuit which has been formed by using a thin film of a vapor-deposited metal; and the like. As for a structure of the touch panel (for instance, projection capacitance type touch panel), the structure is general in which a transparent electrode and a control IC are physically and electrically connected to each other by a wiring circuit. In such a touch panel, a problem occurs that the touch panel becomes not to work normally if the connection between the wiring circuit and the transparent electrode is insufficient.

However, in conventional techniques, there is a problem that a resistance between the transparent electrode and the silver paste becomes unstable in the case where a transparent electrode (sensor electrode, conductive pattern) and a control IC are connected to each other by a silver paste printed wire. In addition, in the conventional techniques, there is a problem that the transparent electrode and the vapor-deposited metal cannot be connected to each other in the case where the transparent electrode (sensor electrode, conductive pattern) and the control IC are connected to each other by a vapor-deposited metal wire. Therefore, the transparent conductive film, which is used as the transparent electrode, is required to be excellent in connectivity to the wiring circuit.

An object of the present invention is to provide a photosensitive conductive film which can provide a transparent conductive film having excellent connectivity to a wiring circuit.

Solution to Problem

The present inventors have examined the above-described problems in detail, and as a result, they have found out that, in a photosensitive conductive film which comprises a support film and a photosensitive layer that is provided on the support film, when an average value of the shortest distances between each of conductive fibers contained in the photosensitive layer and the surface at the side of the support film of the photosensitive layer is 0.1 to 50 nm, a resistance between a transparent conductive film (conductive pattern and the like) and a wiring circuit becomes stably low, and a connectivity of the transparent conductive film to the wiring circuit becomes adequate.

The photosensitive conductive film of the present invention comprises: a support film; and a photosensitive layer provided on the support film, wherein the photosensitive layer contains a plurality of conductive fibers, and an average value of the shortest distances between each of the conductive fibers and the surface at the side of the support film of the photosensitive layer is 0.1 to 50 nm.

The photosensitive conductive film of the present invention can provide a transparent conductive film having the excellent connectivity to the wiring circuit. Such a photosensitive conductive film can be used in manufacture of a layered product which is excellent in the connectivity between the wiring circuit and the transparent conductive film.

It is preferable that the conductive fiber is a silver fiber. In this case, the conductivity of the transparent conductive film to be formed can be easily adjusted.

It is preferable that the fiber diameter of the conductive fiber is 1 to 50 nm. In this case, it is possible to form a transparent conductive film which is highly transparent to visible light.

It is preferable that a fiber length of the conductive fiber is 1 to 100 μm. In this case, contact between the conductive fibers is sufficiently secured, and thereby a transparent conductive film having high transparency and a low resistance value can be easily formed.

It is preferable that the photosensitive conductive film of the present invention has an aspect that the photosensitive layer contains a photopolymerizable compound having an ethylenically unsaturated bond, and that a hydroxyl value of the photopolymerizable compound is 90 mgKOH/g or less. In this case, it is easy to adjust the surface tension of the photosensitive layer.

It is preferable that the photosensitive conductive film of the present invention has an aspect that the photosensitive layer contains a photopolymerizable compound having an ethylenically unsaturated bond, and that a critical surface tension of the photopolymerizable compound is 47 mN/m or less. In this case, it is easy to adjust the surface tension of the photosensitive layer.

It is preferable that the photosensitive layer contains at least one selected from the group consisting of trimethylolpropane tri(meth)acrylate, ethylene oxide-containing trimethylolpropane tri(meth)acrylate, propylene oxide-containing trimethylolpropane tri(meth)acrylate, ditrimethylolpropane tetra(meth)acrylate and dipentaerythritol hexa(meth)acrylate, and it is more preferable that the photosensitive layer contains the trimethylolpropane tri(meth)acrylate. In this case, it is possible to form a transparent conductive pattern having a high resolution, and also it is easy to adjust the surface tension of the photosensitive layer.

Advantageous Effects of Invention

According to the photosensitive conductive film of the present invention, it is possible to obtain a transparent conductive film having the excellent connectivity to the wiring circuit. In addition, according to the photosensitive conductive film of the present invention, it is possible to obtain a conductive pattern (transparent conductive pattern) having the excellent connectivity to the wiring circuit.

According to the present invention, it is possible to provide application of the photosensitive conductive film for forming a transparent conductive film. According to the present invention, it is possible to provide application of the photosensitive conductive film for forming a conductive pattern (transparent conductive pattern). According to the present invention, it is possible to provide application of the photosensitive conductive film for manufacturing a conductive pattern substrate. According to the present invention, it is possible to provide application of the photosensitive conductive film for manufacturing a touch panel (for instance, touch panel sensor).

DESCRIPTION OF EMBODIMENTS

Embodiments of the present invention will be described in detail below.

In the present specification, "(meth)acrylic acid" means an acrylic acid or a methacrylic acid corresponding to the acrylic acid. The same is applied also to other similar expressions such as "(meth)acrylate", "(meth)acrylic resin" and "(meth)acryloxy". "A or B" may contain any one of A and B, and may also contain both of A and B. The materials which are illustrated below by examples may be used singly, or in combination of two or more thereof, unless otherwise specifically indicated. When a plurality of substances corresponding to each ingredient exist in a composition, the content ratio of each of the ingredients in the composition means the total amount of the plurality of substances which exist in the composition, unless otherwise specifically indicated. The term "layer" includes a structure having the shape which is formed on a part, in addition to a structure having the shape which is formed on the whole surface, when the layer has been observed as a plan view.

The weight average molecular weight in the present specification is a value which has been measured on the following conditions according to a gel permeation chromatography method (GPC), and has been converted by a calibration curve that has been prepared with the use of standard polystyrene.

[GPC Condition]

Pump: Hitachi L-6000 type (product name, made by Hitachi, Ltd.)

Column: Gelpack GL-R440, Gelpack GL-R450, and Gelpack GL-R400M (product name, made by Hitachi Chemical Company, Ltd.)

Eluent: tetrahydrofuran

Measurement temperature: 40° C.

Flow rate: 2.05 ml/minute Detector: Hitachi L-3300 type RI (product name, made by Hitachi, Ltd.)

Figure 1:
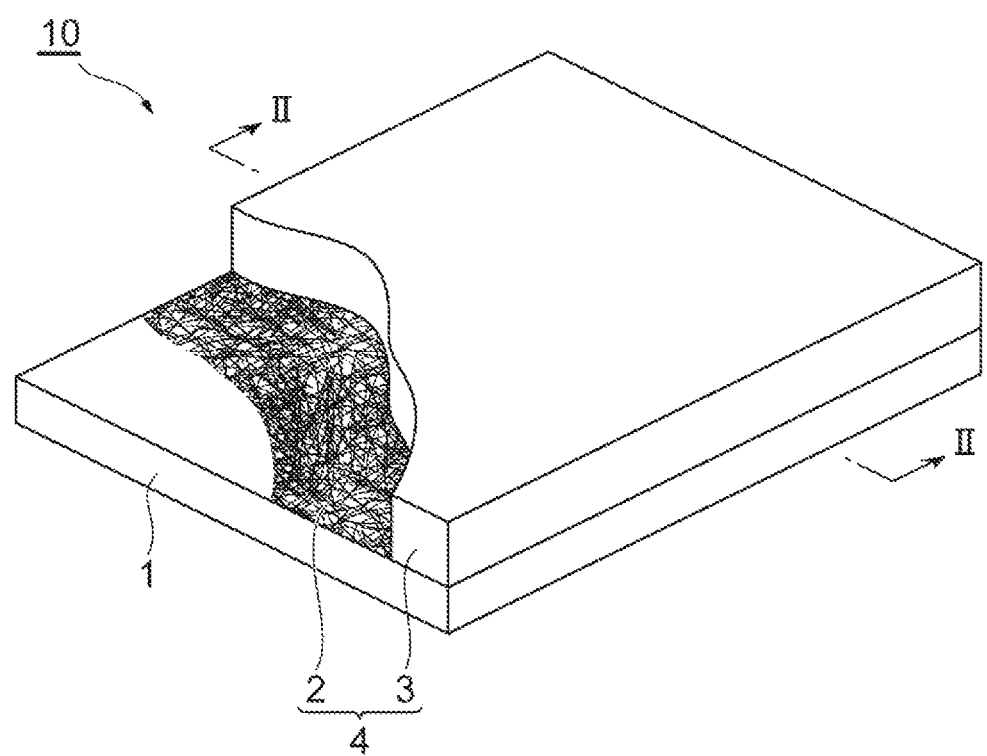
FIG. 1 is a partially cutaway perspective view showing one embodiment of a photosensitive conductive film.
Figure 2:
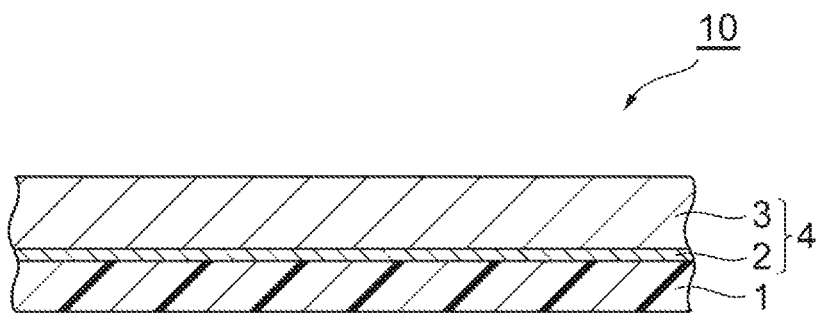
FIG. 2 is a schematic sectional view showing one embodiment of the photosensitive conductive film.

FIG. 1 and FIG. 2 show the photosensitive conductive film of the present embodiment; FIG. 1 is a partially cutaway perspective view showing the photosensitive conductive film; and FIG. 2 is a schematic sectional view taken along the line II-II of FIG. 1. The photosensitive conductive film 10 shown in FIG. 1 and FIG. 2 comprises: a support film 1;

and a photosensitive layer 4 provided on the support film 1. The photosensitive layer 4 has a conductive layer 2 provided on the support film 1, and a photosensitive resin layer 3 provided on the conductive layer 2.

Examples of the support film 1 include a polyethylene terephthalate film (PET film), a polyethylene film, a polypropylene film and a polycarbonate film. Among these, the polyethylene terephthalate film is preferable, from the viewpoint of being excellent in transparency or heat resistance.

The thickness of the support film 1 is preferably 5 µm or more, more preferably 10 µm or more, and further preferably 15 µm or more, from the viewpoint that the support film is prevented from being broken in a step of applying (coating and the like) a conductive dispersion liquid in order to form the conductive layer 2, a step of applying (coating and the like) a photosensitive resin composition in order to form the photosensitive resin layer 3, or in a step of peeling the support film before developing the exposed photosensitive layer 4. The thickness of the support film 1 is preferably 200 µm or less, more preferably 100 µm or less, and further preferably 50 µm or less, from the viewpoint of being excellent in a resolution of a conductive pattern formed after the photosensitive layer 4 has been exposed to light and developed. From these viewpoints, the thickness of the support film 1 is preferably 5 to 200 µm, more preferably 10 to 100 µm, and further preferably 15 to 50 µm.

The conductive layer 2 and the photosensitive resin layer 3 contain a photosensitive resin composition, for instance. The conductive layer 2 and the photosensitive resin layer 3 may contain the same constitutional component, and may also contain different constitutional components from each other. The composition of the conductive layer 2 may be, for instance, such a composition that the conductive fiber is added to the composition of the photosensitive resin layer 3. Incidentally, it may be such an aspect that the boundary between the conductive layer 2 and the photosensitive resin layer 3 is not clear. Constitutional component of one out of the conductive layer 2 and the photosensitive resin layer 3 may permeates the other out of the conductive layer 2 and the photosensitive resin layer 3. For instance, the constitutional component of the photosensitive resin layer 3 may have permeated the conductive layer 2.

The photosensitive layer 4 contains a plurality (a plurality of pieces) of conductive fibers, and, for instance, the conductive layer 2 of the photosensitive layer 4 contains the plurality of conductive fibers. Examples of the conductive fiber include: a metal fiber such as a gold fiber, a silver fiber and a platinum fiber; and a carbon fiber such as a carbon nanotube. The conductive fiber is preferably the gold fiber or the silver fiber, from the viewpoint of being excellent in conductivity. The conductive fiber is more preferably the silver fiber, from the viewpoint that the conductivity of a transparent conductive film to be formed can be easily adjusted. The conductive fibers can be used singly or in combination of two or more thereof.

The metal fiber can be prepared by a method of reducing a metal ion with a reducing agent such as $NaBH_4$, a polyol method, or the like. In addition, as the above-described carbon nanotube, it is possible to use a commercial product such as a Hipco single layer carbon nanotube made by Unidym Inc.

The average value of the shortest distances between each of the conductive fibers and the surface at the side of the support film 1 of the photosensitive layer 4 is 0.1 to 50 nm, when the existence (position) of the conductive fibers in the photosensitive layer 4 has been examined, from the viewpoint of obtaining a transparent conductive film which is excellent in connectivity to the wiring circuit. In other words, in the photosensitive conductive film of the present embodiment, the conductive fibers exist so that the above-described average value of the shortest distances of the conductive fibers satisfies a range of 0.1 to 50 nm. When the above-described average value of the shortest distances of the conductive fibers exceeds 50 nm, the conductivity is hindered by the electrical insulation properties of the resin layer existing between the conductive fibers and the wiring circuit, and thereby the connection to the wiring circuit becomes insufficient. When the above-described average value of the shortest distances of the conductive fibers is less than 0.1 nm, a corrosive component in the air at an external environment becomes easy to reach the conductive fibers, and accordingly, there are such tendencies that the conductive layer becomes easy to be corroded under high temperature and high humidity, the resistance value increases, and the connection becomes insufficient.

The surface at the side of the support film 1 of the photosensitive layer 4 is a surface to be connected (connection surface) which is connected to the wiring circuit and the like, when the photosensitive layer 4 is layered on the substrate so that the photosensitive resin layer 3 side of the photosensitive layer 4 comes in contact with the substrate. The term "surface to be connected" is, for instance, an interface between the support film 1 and the photosensitive layer 4 in FIG. 2. The term "surface to be connected" is defined on the basis that, for instance, when the conductive layer 2 is provided on the substrate by layering the photosensitive layer 4 on the substrate by laminating or the like so that the photosensitive resin layer 3 side of the photosensitive layer 4 comes in contact with the substrate, the surface having the conductive layer 2 provided thereon becomes a portion to be connected.

Methods for examining the existence (position) of the conductive fibers in the photosensitive layer 4 include, for instance, a method of measuring a distance from the surface to be connected of the photosensitive conductive film with a transmission electron microscope. The position of the conductive fiber can be checked by an operation of observing the cross section of the photosensitive conductive film with the transmission electron microscope. It is preferable to check, for instance, five or more cross sections, because the observation range is limited. There is no upper limit in the number of the portions to be measured, but if the number is too large, the measurement takes a period of time and a labor, and accordingly the number is preferably 20 or less portions. The average value of the above-described shortest distances of the conductive fibers can be obtained by: selecting all of the conductive fibers in an arbitrary range of 500 nm×500 nm, which contains at least one conductive fiber, in the observed image which has been obtained with the transmission electron microscope; measuring the shortest distance of each of the respective conductive fibers; and calculating the average value of the shortest distances.

When the average value of the above-described shortest distances of the conductive fibers exceeds 50 nm, the surface to be connected of the photosensitive layer may be etched at a stage prior to connection with the wiring circuit, in order that the average value of the above-described shortest distances of the conductive fibers is adjusted to be within the above-described range. Examples of etching methods include: a method of performing a wet treatment with a chemical liquid such as alkali; and a dry treatment method such as plasma.

In addition, as an another method, it is possible to control the position of the conductive fiber by adjusting the wettability of the photosensitive layer 4. If the wettability of the conductive layer 2 with the photosensitive resin layer 3 is inferior, the conductive fiber tends to approach the surface to be connected of the photosensitive layer 4, and if the wettability of the conductive layer 2 with the photosensitive resin layer 3 is superior, the conductive fiber tends to be positioned at the inner side (at the opposite side to surface to be connected side) of the photosensitive layer 4. Methods for enhancing the wettability of the conductive layer 2 with the photosensitive resin layer 3 include: a method of increasing a surfactant which is added to a conductive dispersion liquid when the conductive dispersion liquid for forming the conductive layer 2 is applied (coated or the like); and a method for enhancing the surface tension of the photosensitive resin.

The methods for enhancing the surface tension of the photosensitive resin include a method of increasing a polar group such as a hydroxyl group and a carboxyl group in the photosensitive resin (photopolymerizable compound or the like). The surface tension is formed of a dispersion force and a polar force. The polar forces include a Van der Waals force based on the polarity, a hydrogen bonding force, and an acid-base interactive force. Therefore, when the photopolymerizable compound having a polar group such as a hydroxyl group is used, the polar force increases, and the surface tension becomes high. Specifically, when the resin is used, the surface tension of the resin can be increased by increasing the content ratio of a copolymerizable component such as (meth)acrylic acid and 2-hydroxyethyl (meth)acrylate.

The average value of the above-described shortest distances of the conductive fibers is preferably 1 nm or more, and more preferably 10 nm or more, from the viewpoints that the conductive layer is easily prevented from being corroded under high temperature and high humidity, and that the resistance value is easily prevented from increasing. The average value of the above-described shortest distances of the conductive fibers is preferably 45 nm or less, more preferably 40 nm or less, further preferably 30 nm or less, and particularly preferably 20 nm or less, from the viewpoint that the connection with the wiring circuit is easily and sufficiently secured. From these viewpoints, the average value of the above-described shortest distances of the conductive fibers is preferably 1 to 50 nm, and more preferably 10 to 50 nm.

It is preferable that the photosensitive layer 4 contains the conductive fiber having the following fiber diameter (diameter). The fiber diameter of the conductive fiber is preferably 1 nm or more, more preferably 2 nm or more, and further preferably 3 nm or more, from the viewpoint that the conductive fibers are easily prevented from agglomerating in the conductive dispersion liquid. The fiber diameter of the conductive fiber is preferably 50 nm or less, more preferably 45 nm or less, and further preferably 40 nm or less, from the viewpoint of enhancing the transparency to visible light. From these viewpoints, the fiber diameter of the conductive fiber is preferably 1 to 50 nm, more preferably 2 to 45 nm, and further preferably 3 to 40 nm.

It is preferable that the photosensitive layer 4 contains a conductive fiber having the following fiber length. The fiber length of the conductive fiber is preferably 1 µm or more, more preferably 3 µm or more, and further preferably 5 µm or more, from the viewpoint that contact points among the conductive fibers are sufficiently secured, and a conductive film having high transparency and a low resistance value can be easily formed. The fiber length of the conductive fiber is preferably 100 µm or less, more preferably 50 µm or less, and further preferably 25 µm or less, from the viewpoint that the conductive fibers are easily prevented from agglomerating in the conductive dispersion liquid. From these viewpoints, the fiber length of the conductive fiber is preferably 1 to 100 µm, more preferably 3 to 50 µm, and further preferably 5 to 25 µm.

The fiber diameter and the fiber length can be measured with a scanning electron microscope.

The conductive layer 2 can further contain an organic conductor in addition to the conductive fiber. Any material can be used as the organic conductor without being particularly limited, but it is preferable to use a polymer such as a thiophene derivative and an aniline derivative. As the polymers for the organic conductor, specifically, polyethylene dioxythiophene, polyhexylthiophene, polyaniline and the like can be used. The organic conductors can be used singly or in combination of two or more thereof.

It is preferable that the thickness of the conductive layer 2 is in the following range in terms of the thickness after drying, though being different depending on applications of the transparent conductive film or the conductive pattern which is formed with the use of the photosensitive conductive film of the present embodiment, or on required conductivity. The thickness of the conductive layer 2 is preferably 1 µm or less, more preferably 0.5 µm or less, and further preferably 0.1 µm or less, from the viewpoint of showing high light transmittance in a wavelength band of 450 to 650 nm, showing excellent pattern formability, and particularly, being suitable for production of a transparent electrode. The thickness of the conductive layer 2 is preferably 1 nm or more, and more preferably 5 nm or more, from the viewpoint that high conductivity can be easily obtained. From these viewpoints, the thickness of the conductive layer 2 is preferably 1 µm or less, more preferably 1 nm to 0.5 µm, and further preferably 5 nm to 0.1 µm. The thickness of the conductive layer 2 means a value which is measured on the basis of a scanning electron microscope photograph.

The conductive layer 2 can be formed by applying a conductive dispersion liquid which contains, for instance, a conductive fiber, an organic conductor, water, an organic solvent, a dispersion stabilizer, a surfactant or the like, onto the support film 1, and then drying. The conductive layer 2 which is formed on the support film 1 after having been dried may be laminated as needed.

The application (coating and the like) can be performed by a known method such as a roll coating method, a comma coating method, a gravure coating method, an air knife coating method, a die coating method, a bar coating method and a spray coating method.

The drying can be performed at 30 to 150° C. for approximately 1 to 30 minutes, with the use of a hot air convection type drier and the like. In the conductive layer 2, the conductive fiber or the organic conductor may coexist with the surfactant or the dispersion stabilizer.

The conductive layer 2 may contain the conductive fiber and the organic conductor in combination. In this case, the conductive layer 2 may be formed by applying a liquid containing the conductive fiber and the organic conductor, or the conductive layer 2 may be formed by sequentially apply a dispersion liquid containing the conductive fiber and a solution containing the organic conductor. For instance, the conductive layer 2 can be formed by applying the dispersion liquid which contains the conductive fiber, and then applying and drying the solution which contains the organic conductor.

The constitutional component of the photosensitive layer 4 (conductive layer 2 and photosensitive resin layer 3) is not limited, but it is preferable that the photosensitive layer 4 contains (A) binder polymer, (B) photopolymerizable compound having an ethylenically unsaturated bond (hereinafter occasionally referred to as "component (B)"), and (C) photopolymerization initiator. For instance, it is preferable that the photosensitive resin layer 3 contains (A) binder polymer, (B) photopolymerizable compound having an ethylenically unsaturated bond, and (C) photopolymerization initiator.

(A) binder polymer will be described below. Examples of (A) binder polymer include: a (meth)acrylic resin (a resin having structural unit derived from a polymerizable monomer having a (meth)acryloyl group); a styrene resin (a resin having structural unit derived from a polymerizable monomer having a styrene group, though excepting resin corresponding to (meth)acrylic resin); an epoxy resin; an amide resin; an amide-epoxy resin; an alkyd resin; a phenol resin; an ester resin; an urethane resin; an epoxy (meth)acrylate resin obtained by reaction between the epoxy resin and (meth)acrylic acid; and an acid-modified epoxy (meth)acrylate resin obtained by reaction between the epoxy (meth) acrylate resin and the acid anhydride. (A) binder polymer can be used singly or in combination of two or more thereof.

It is preferable that (A) binder polymer has a carboxyl group, from the viewpoint of making alkali developing properties further adequate. Examples of the polymerizable monomer having a carboxyl group (a polymerizable monomer for obtaining a binder polymer having a carboxyl group) include (meth)acrylic acid.

A ratio (ratio of a polymerizable monomer having a carboxyl group, with respect to all polymerizable monomers to be used, or ratio of a structural unit derived from a polymerizable monomer having a carboxyl group, with respect to structural units derived from all polymerizable monomers to be used) of a carboxyl group which (A) binder polymer has is preferably 5 mass % or more, from the viewpoint of being further excellent in the alkali developing properties. The above-described ratio is preferably 20 mass % or less, more preferably 19 mass % or less, further preferably 18 mass % or less, particularly preferably 17 mass % or less, and extremely preferably 16 mass % or less, from the viewpoint that it is easy to adjust the surface tension of the resin. The above-described ratio is preferably 5 to 20 mass %, more preferably 5 to 19 mass %, further preferably 5 to 18 mass %, particularly preferably 5 to 17 mass %, and extremely preferably 5 to 16 mass %, from the viewpoint of being excellent in balance between the alkali developing properties and the wettability (surface tension).

The weight average molecular weight of (A) binder polymer is preferably 5000 or more, more preferably 20000 or more, and further preferably 30000 or more, from the viewpoint of being excellent in photographic developer resistance. The weight average molecular weight of (A) binder polymer is preferably 300000 or less, more preferably 150000 or less, and further preferably 100000 or less, from the viewpoint of being excellent in a developing period of time. The weight average molecular weight of (A) binder polymer is preferably 5000 to 300000, more preferably 20000 to 150000, and further preferably 30000 to 100000, from the viewpoint that the balance between the mechanical strength and the alkali developing properties is achieved.

The content ratio of the component (A) is preferably 30 parts by mass or more, and more preferably 40 parts by mass or more, with respect to 100 parts by mass of the total amount of (A) binder polymer and (B) photopolymerizable compound, from the viewpoint of being excellent in photocurability and coating properties onto the support film 1. The content ratio of the component (A) is preferably 80 parts by mass or less, and more preferably 70 parts by mass or less, with respect to 100 parts by mass of the total amount of (A) binder polymer and (B) photopolymerizable compound, from the viewpoint of being excellent in storage stability when having been wound as the film. From these viewpoints, the content ratio of the component (A) is preferably 30 to 80 parts by mass, and more preferably 40 to 70 parts by mass.

Next, (B) photopolymerizable compound having an ethylenically unsaturated bond will be described below. As the component (B), it is possible to use a known compound without being particularly limited.

Examples of the component (B) include, specifically, (meth)acrylic acid, 2-hydroxyethyl (meth)acrylate, bisphenol-A-di(meth)acrylate compound, polyethylene glycol di(meth)acrylate, polypropylene glycol di(meth)acrylate, polyethylene-polypropylene glycol di(meth)acrylate, trimethylolpropane di(meth)acrylate, trimethylolpropane tri(meth)acrylate, ethylene oxide (EO)-containing trimethylolpropane tri(meth)acrylate, propylene oxide (PO)-containing trimethylolpropane tri(meth)acrylate, trimethylolpropane ethoxy tri(meth)acrylate, trimethylolpropane diethoxy tri(meth)acrylate, trimethylolpropane triethoxy tri(meth)acrylate, trimethylolpropane tetraethoxy tri(meth)acrylate, trimethylolpropane pentaethoxy tri(meth)acrylate, ditrimethylolpropane tetra(meth)acrylate, tetramethylolmethane tri(meth)acrylate, tetramethylolmethane tetra(meth)acrylate, dipentaerythritol penta(meth)acrylate, and dipentaerythritol hexa(meth)acrylate. The hydroxyl values of these substances are different according to esterification rates in a manufacturing process, respectively. Examples of the bisphenol-A-di(meth)acrylate compound include 2,2-bis(4-((meth)acryloxypolyethoxy)phenyl)propane, 2,2-bis(4-((meth)acryloxypolypropoxy)phenyl)propane, and 2,2-bis(4-((meth)acryloxypolyethoxypolypropoxy)phenyl) propane.

The hydroxyl value of the component (B) is preferably 90 mgKOH/g or less, more preferably 80 mgKOH/g or less, further preferably 50 mgKOH/g or less, and particularly preferably 10 mgKOH/g or less, from the viewpoint that it is easy to adjust the surface tension of the photosensitive resin. When two or more types of component (B) are used in combination, it is preferable to select the compounds so that the total sum of values, which is obtained by multiplying the hydroxyl values of the respective photopolymerizable compound by the mass fraction, is 90 mgKOH/g or less. Such a hydroxyl value of the total of the components (B) is more preferably 80 mgKOH/g or less, further preferably 50 mgKOH/g or less, and particularly preferably 10 mgKOH/g or less.

It is possible to reduce the hydroxyl value of the component (B) by selecting the photopolymerizable compound which does not contain a hydroxyl group in the structural formula, or by reducing the amount of the photopolymerizable compound containing a hydroxyl group.

The photopolymerizable compound which does not contain a hydroxyl group is preferably at least one selected from the group consisting of trimethylolpropane tri(meth)acrylate, ethylene oxide (EO)-containing trimethylolpropane tri (meth)acrylate, propylene oxide (PO)-containing trimethylolpropane tri(meth)acrylate, ditrimethylolpropane tetra (meth)acrylate, and dipentaerythritol hexa(meth)acrylate; and more preferably the trimethylolpropane tri(meth)acrylate, from the viewpoint of being excellent in resolution.

The critical surface tension of the component (B) is preferably 47 mN/m or less, more preferably 46 mN/m or less, and further preferably 45 mN/m or less, from the viewpoint that it is easy to adjust the surface tension of the photosensitive resin. The critical surface tension can be measured with a known technology. The critical surface tension can be measured, for instance, with a method of measuring a contact angle (contact angle method) of a liquid of which the surface tension is known, with respect to the surface of a film containing the component (B).

The content ratio of the component (B) is preferably 30 parts by mass or more, and more preferably 40 parts by mass or more, with respect to 100 parts by mass of the total amount of (A) binder polymer and (B) photopolymerizable compound, from the viewpoint of being excellent in photocurability and coating film properties of the transferred photosensitive resin layer. The content ratio of the component (B) is preferably 80 parts by mass or less, and more preferably 70 parts by mass, with respect to 100 parts by mass of the total amount of (A) binder polymer and (B) photopolymerizable compound, from the viewpoint of being excellent in storage stability when having been wound as the film. From these viewpoints, the content ratio of the component (B) is preferably 30 to 80 parts by mass, and more preferably 40 to 70 parts by mass.

Next, (C) photopolymerization initiator will be described below. (C) photopolymerization initiator is not limited in particular as long as (C) photopolymerization initiator is selected so that a light wavelength of a exposure machine to be used matches a wavelength necessary for the function to be developed, but Examples includes an aromatic ketone, an oxime ester compound, a phosphine oxide compound, a benzyl derivative, a 2,4,5-triarylimidazole dimer, an acridine derivative, N-phenylglycine, an N-phenylglycine derivative, a coumarin-based compound, and an oxazol-based compound. (C) photopolymerization initiator can be used singly or in combination of two or more thereof. Among (C) photopolymerization initiator, the oxime ester compound is preferable, from the viewpoint of being excellent in sensitivity, transparency and pattern forming capability. The oxime ester compound is preferably at least one selected from the group consisting of a compound represented by the following formula (1), a compound represented by the following formula (2) and a compound represented by the following formula (3), from the viewpoint of being excellent in sensitivity, resolution and transparency.

[Formula 1]

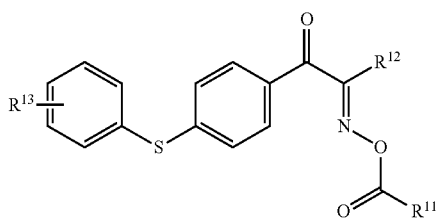

(1)

In the formula (1), $R^{11}$ and $R^{12}$ each independently represent an alkyl group having 1 to 12 carbon atoms, a cycloalkyl group having 4 to 10 carbon atoms, a phenyl group or a tolyl group. From the viewpoint of being excellent in sensitivity, $R^{11}$ and/or $R^{12}$ is preferably an alkyl group having 1 to 8 carbon atoms, a cycloalkyl group having 4 to 6 carbon atoms, a phenyl group or a tolyl group; more preferably an alkyl group having 1 to 4 carbon atoms, a cycloalkyl group having 4 to 6 carbon atoms, a phenyl group or a tolyl group; and further preferably a methyl group, a cyclopentyl group, a phenyl group or a tolyl group.

$R^{13}$ represents —H, —OH, —COOH, —O(CH$_2$)OH, —O(CH$_2$)$_2$OH, —COO(CH$_2$)OH or —COO(CH$_2$)$_2$OH; from the viewpoint of being excellent in developing properties, $R^{13}$ is preferably —H, —O(CH$_2$)OH, —O(CH$_2$)$_2$OH, —COO(CH$_2$)OH or —COO(CH$_2$)$_2$OH; and more preferably —H, —O(CH$_2$)$_2$OH or —COO(CH$_2$)$_2$OH.

[Formula 2]

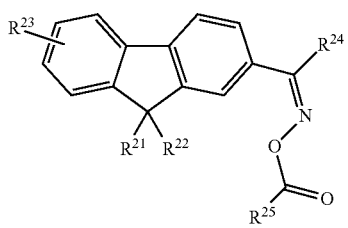

(2)

In the formula (2), $R^{21}$ and $R^{22}$ each independently represent an alkyl group having 1 to 6 carbon atoms. It is preferable that $R^{2'}$ and/or $R^{22}$ are a propyl group. $R^{23}$ represents —NO$_2$ or —ArCO. Ar represents an aryl group. Examples of the aryl group include a phenyl group and a tolyl group. It is preferable that Ar is a tolyl group. $R^{24}$ and $R^{25}$ each independently represent an alkyl group having 1 to 12 carbon atoms, a phenyl group or a tolyl group. It is preferable that $R^{24}$ and/or $R^{25}$ are a methyl group, a phenyl group or a tolyl group.

[Formula 3]

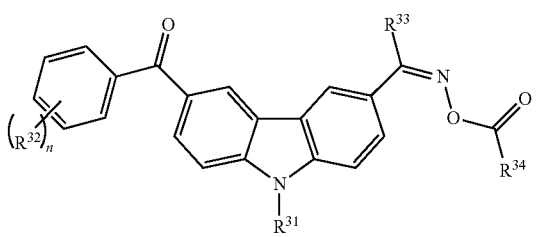

(3)

In the formula (3), $R^{31}$ represents an alkyl group having 1 to 6 carbon atoms, and is preferably an ethyl group. $R^{32}$ each independently represents an alkyl group having 1 to 18 carbon atoms or an organic group having an acetal bond, and is preferably a (2,2-dimethyl-1,3-dioxolane-4-yl)methoxy group (substituent group contained in formula (3-1) described later). $R^{33}$ and $R^{34}$ each independently represent an alkyl group having 1 to 12 carbon atoms, a phenyl group or a tolyl group. From the viewpoint of being excellent in solubility, $R^{33}$ and/or $R^{34}$ are preferably a methyl group, a phenyl group or a tolyl group, and more preferably are a methyl group. n denotes an integer of 1 to 5, and is preferably 2, from the viewpoint of being excellent in stability of the compound.

Examples of the compound represented by the above formula (1) include, for instance, a compound represented by the following formula (1-1). This compound is available as ADEKA ARKLS NCI-930 (product name, made by ADEKA CORPORATION).

[Formula 4]

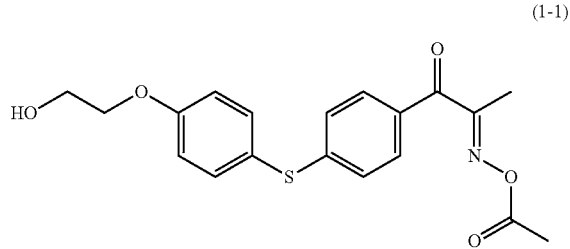

(1-1)

Examples of the compound represented by the above formula (2) include, for instance, a compound represented by the following formula (2-1). This compound is available as DFI-091 (product name, made by Daito Chemix, Corporation).

[Formula 5]

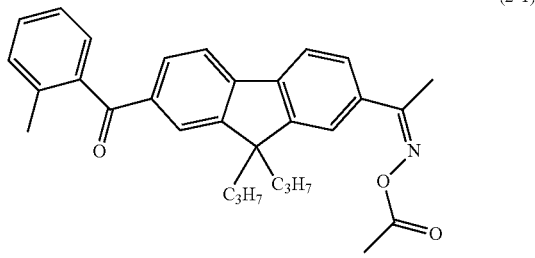

(2-1)

Examples of the compound represented by the above formula (3) include, for instance, a compound represented by the following formula (3-1). This compound is available as Adeka Optomer N-1919 (product name, made by ADEKA CORPORATION)

[Formula 6]

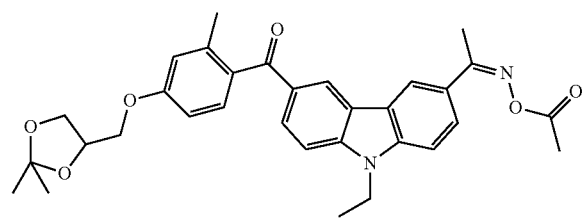

(3-1)

The content ratio of (C) photopolymerization initiator is preferably 0.1 parts by mass or more, more preferably 0.5 parts by mass or more, and farther preferably 1 part by mass or more, with respect to 100 parts by mass of the total amount of (A) binder polymer and (B) photopolymerizable compound, from the viewpoint of being excellent in light sensitivity. The content ratio of (C) photopolymerization initiator is preferably 20 parts by mass or less, more preferably 10 parts by mass or less, and further preferably 5 parts by mass or less, with respect to 100 parts by mass of the total amount of (A) binder polymer and (B) photopolymerizable compound, from the viewpoint of being excellent in photocurability of the inside. From these viewpoints, the content ratio of (C) photopolymerization initiator is preferably 0.1 to 20 parts by mass, more preferably 0.5 to 10 parts by mass, and further preferably 1 to 5 parts by mass.

The photosensitive layer 4 (conductive layer 2 and photosensitive resin layer 3) can contain additives such as an adhesion-imparting agent, a plasticizer, a filler, a defoaming agent, a fire retardant, a stabilizer, a leveling agent, a peeling promoter, an oxidation inhibitor, a flavor, an imaging agent and a thermal crosslinking agent, singly or in combination of two or more thereof, as needed.

The photosensitive resin layer 3 can be formed on the support film 1 which has the conductive layer 2 formed thereon, by applying and drying a solution of the photosensitive resin composition having approximately 10 to 60 mass % of a solid content that has dissolved in the solvent. However, in this case, it is preferable that the amount of the organic solvent remaining in the photosensitive resin layer 3 after drying is 2 mass % or less, so as to prevent the organic solvent from diffusing in subsequent steps.

The application (coating and the like) of the photosensitive resin composition for obtaining the photosensitive resin layer 3 can be performed with a known method such as a roll coating method, a comma coating method, a gravure coating method, an air knife coating method, a die coating method, a bar coating method and a spray coating method. The drying for removing the organic solvent and the like after the application can be performed at 70 to 150° C. for approximately 5 to 30 minutes, with a hot air convection type drier and the like.

The thickness of the photosensitive resin layer 3 varies depending on the application, but is preferably in the following range in terms of the thickness after drying. The thickness of the photosensitive resin layer 3 is preferably 0.5 μm or more, more preferably 1 μm or more, and further preferably 2 μm or more, from the viewpoint of facilitating the application (coating and the like) of the solution of the photosensitive resin composition for obtaining the photosensitive resin layer 3. The thickness of the photosensitive resin layer 3 is preferably 50 μm or less, more preferably 15 μm or less, and further preferably 10 μm or less, from the viewpoint that reduction of light transmittance is suppressed to obtain sufficient sensitivity, and therefore, the photocurability of the photosensitive resin layer to be transferred is sufficiently secured. From these viewpoints, the thickness of the photosensitive resin layer 3 is preferably 0.5 to 50 μm, more preferably 1 to 15 μm, and further preferably 2 to 10 μm.

In the photosensitive conductive film of the present embodiment, the minimum light transmittance in a wavelength band of 450 to 650 nm of the layered product of the conductive layer 2 and the photosensitive resin layer 3 is preferably 80% or more, and more preferably 85% or more, when the total film thickness of both of the layers is set at 1 to 10 μm.

<Method for Forming Conductive Pattern>

Figure 3:
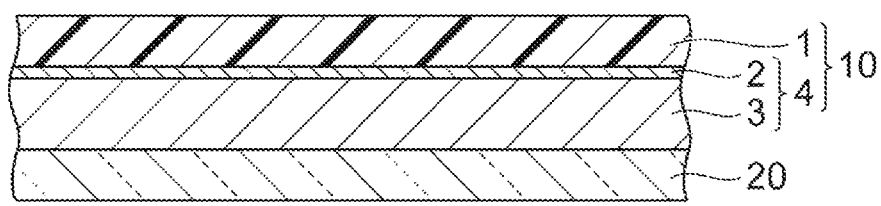
FIG. 3 is a schematic sectional view showing one embodiment of a method for forming a conductive pattern by using the photosensitive conductive film.
Figure 3:
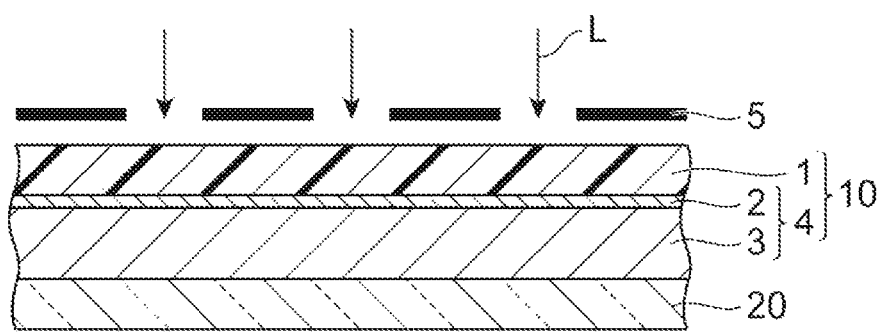
Figure 3:
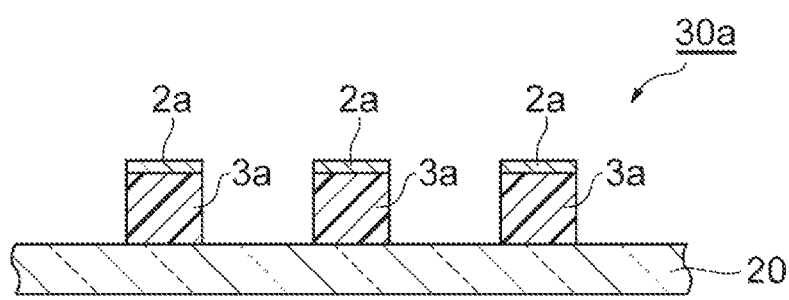
Figure 4:
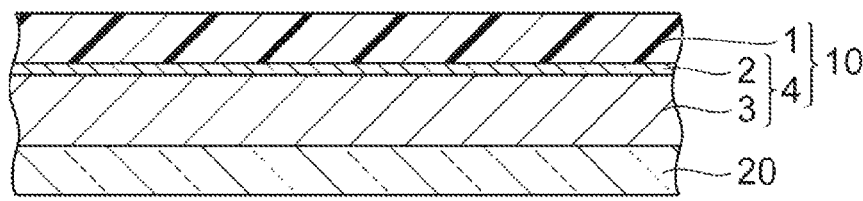
FIG. 4 is a schematic sectional view showing another embodiment of a method for forming a conductive pattern by using the photosensitive conductive film.
Figure 4:
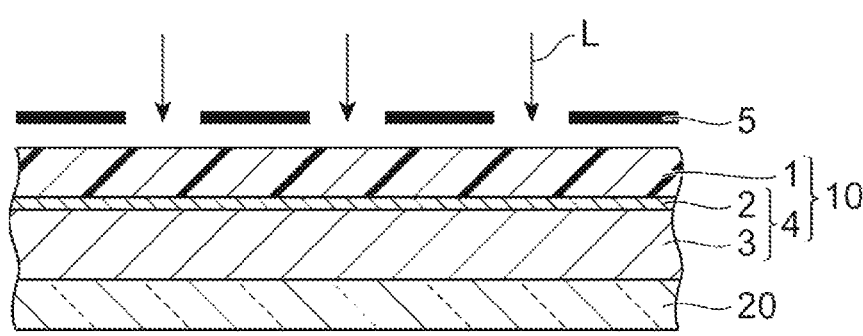
Figure 4:
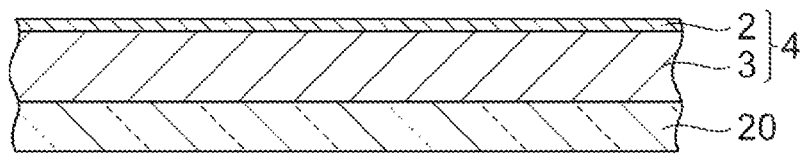
Figure 4:
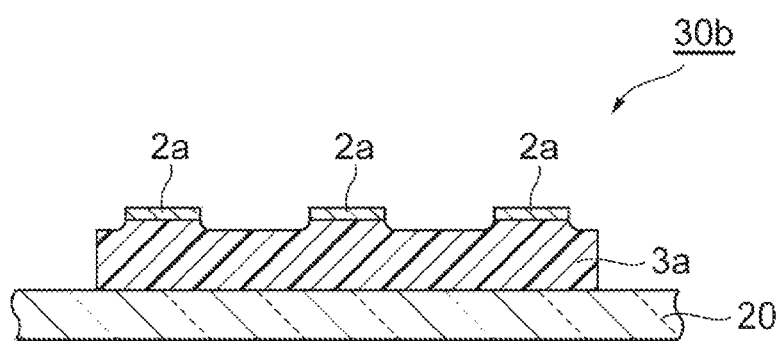

FIG. 3 and FIG. 4 are schematic sectional views showing one embodiment of a method for forming a conductive pattern by using the photosensitive conductive film. The method for forming the conductive pattern by using the photosensitive conductive film of the present embodiment comprises, for instance, a lamination step, an exposure step, and a development step, in this order. In the lamination step, the photosensitive conductive film 10 of the present embodiment is laminated on the substrate 20 so that the photosensitive resin layer 3 comes in close contact with the substrate 20 (FIG. 3(a) and FIG. 4(a)). In the lamination step, the layered product is obtained, and the layered product comprises the substrate 20 and the photosensitive conductive film 10 that is arranged on the substrate 20. The exposure step has a first exposure step (FIG. 3(a) and FIG. 4(b)) of irradiating a predetermined portion of the photosensitive layer 4 on the substrate 20 with active rays of light L, while leaving the support film 1. The exposure step may further have a second exposure step of peeling the support film 1, and then irradiating with the active rays of light L, after the first exposure step, as shown in FIG. 4(c). In the exposure step, it is possible to irradiate with the active rays of light L through a mask pattern 5. In the development step, the conductive pattern 2a is formed by developing the exposed photosensitive layer 4 (FIG. 3(c) and FIG. 4(d)). Through these steps, conductive pattern substrates 30a and 30b (FIG. 3(c) and FIG. 4(d)) are obtained, and the conductive pattern substrates 30a and 30b have the patterned conductive pattern 2a and a cured resin layer 3a provided on the substrate 20. Thus, the conductive pattern substrate of the present embodiment comprises a cured material of the photosensitive layer of the photosensitive conductive film of the present embodiment.

<Touch Panel Sensor>

The touch panel sensor of the present embodiment comprises the conductive pattern substrate of the present embodiment. The touch panel sensor having the transparent electrode which has been prepared by using the photosensitive conductive film of the present embodiment can comprise, for instance, the above-described conductive pattern substrate 30a, 30b.

Figure 5:
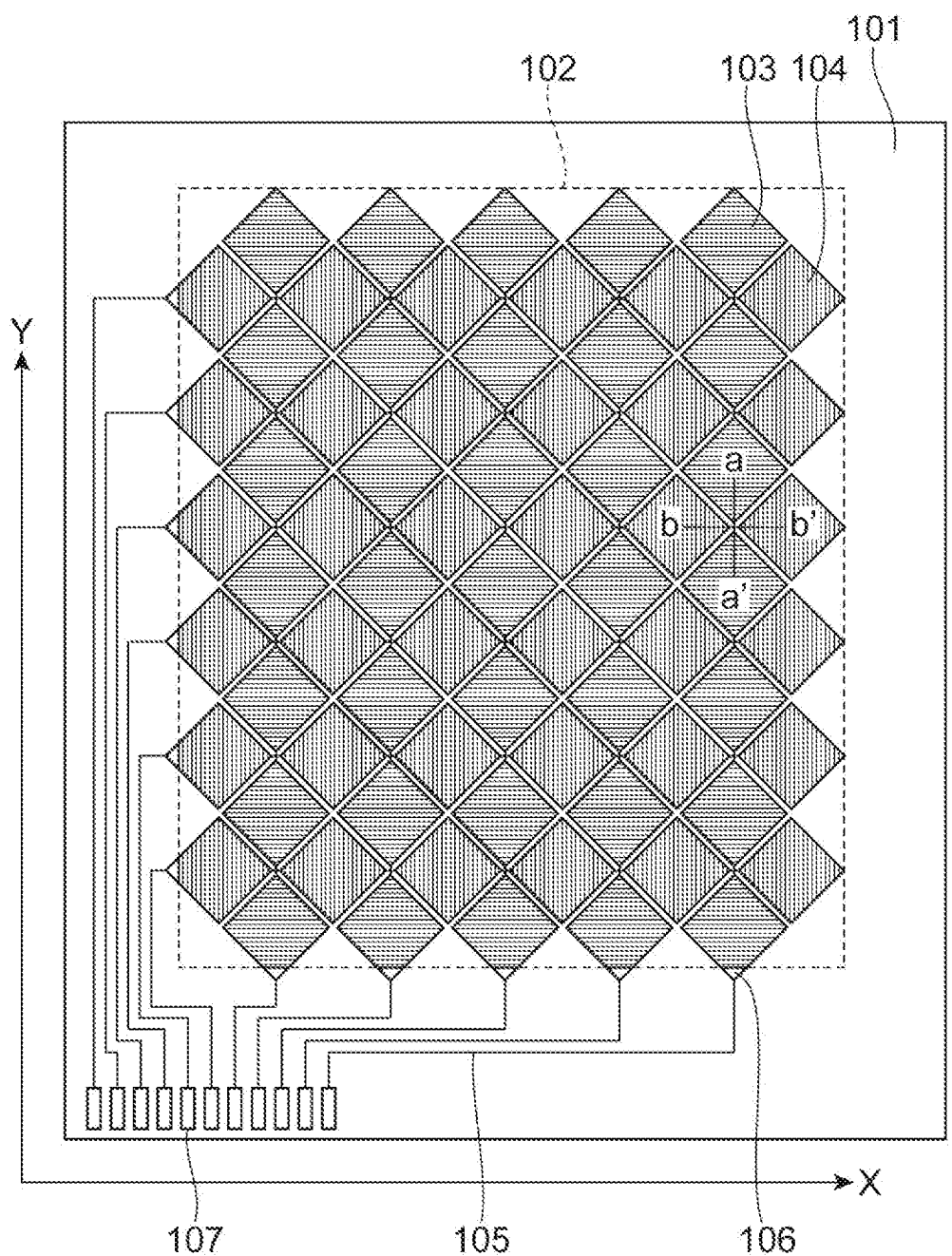
FIG. 5 is a schematic top view showing one example of a capacitance-type touch panel sensor.

FIG. 5 is a schematic top view showing one example of a capacitance-type touch panel sensor. In FIG. 5, a transverse direction shows an X coordinate, and a longitudinal direction shows a Y coordinate. In the touch panel sensor shown in FIG. 5, a touch screen 102 for detecting a touched position is arranged on one surface of the transparent substrate 101. In the region of this touch screen 102, there are arranged transparent electrodes 103 which detect a change of the capacitance to determine an X position coordinate, and transparent electrodes 104 which detect the change of the capacitance to determine as a Y position coordinate. To these transparent electrodes 103 and 104, drawing wires 105 for connecting with a driver element circuit which controls electrical signals for functioning as the touch panel, and connection electrodes 106 which connect the drawing wires 105 to the transparent electrodes 103 and 104 are connected. Furthermore, connection terminals 107 which are connected to the driver element circuit are arranged on the ends of the drawing wires 105 at an opposite side to the connection electrodes 106 side.

Figure 6:
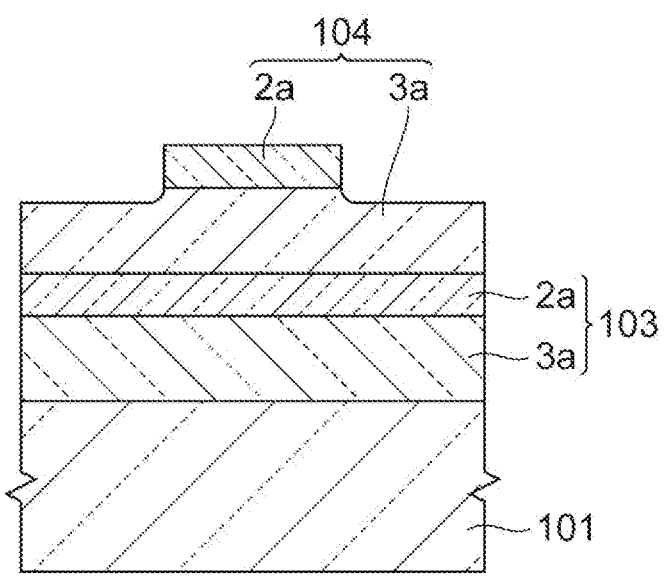
FIG. 6 is a partial sectional view taken along the line a-a' shown in FIG. 5.
Figure 7:
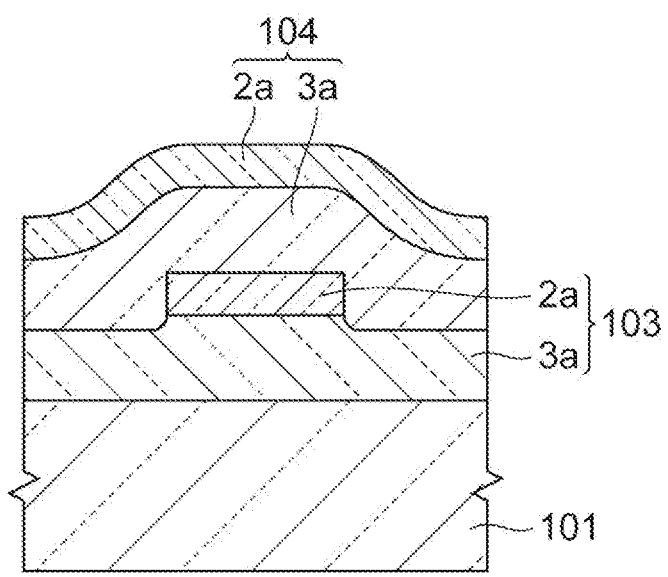
FIG. 7 is a partial sectional view taken along the line b-b' shown in FIG. 5.

FIG. 6 is a partial sectional view taken along the line a-a' shown in FIG. 5. FIG. 7 is a partial sectional view taken along the line b-b' shown in FIG. 5. These views show an intersection of the transparent electrode in the XY position coordinates. As shown in FIG. 6 and FIG. 7, by forming the transparent electrodes with the above-described method for forming the conductive pattern, it is possible to obtain a touch panel sensor in which the step is small and the smoothness is high.

Figure 8:
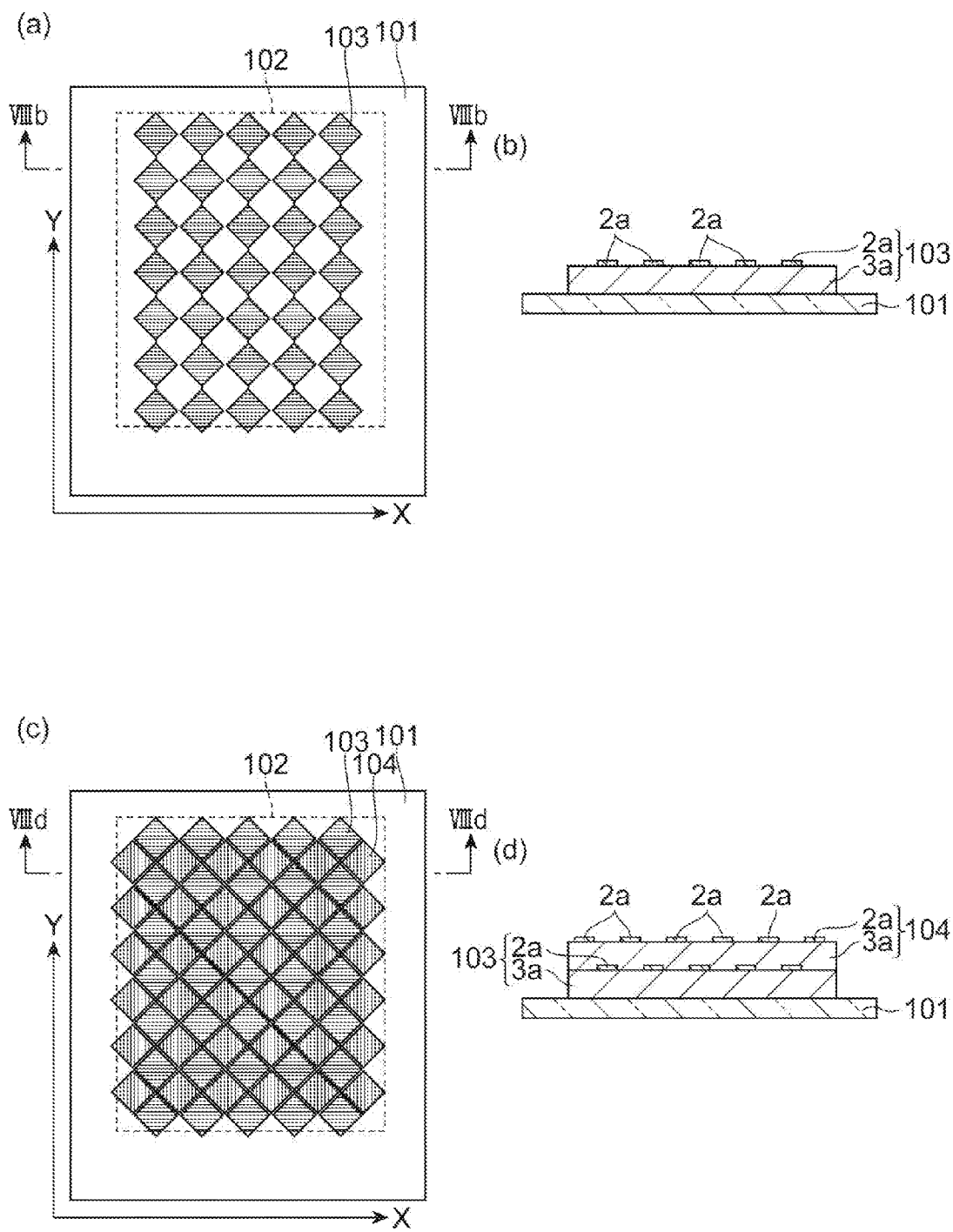
FIG. 8 is a schematic view showing one example of a method for manufacturing a touch panel sensor shown in FIG. 5.

FIG. 8 is a schematic view showing one example of a method for manufacturing a touch panel sensor shown in FIG. 5. FIG. 8(a) and FIG. 8(c) are schematic top views showing one example of the touch panel sensor; FIG. 8(b) is a schematic sectional view taken along the line of FIG. 8(a); and FIG. 8(d) is a schematic sectional view taken along the line VIIId-VIIId of FIG. 8(c).

In the present embodiment, the transparent electrodes 103 and 104 are formed by the above-described method for forming the conductive pattern. Firstly, the transparent electrodes (X position coordinate) 103 are formed in a region of the touch screen 102 on the transparent substrate 101, as shown in FIG. 8(a). Specifically, the photosensitive conductive film 10 is laminated so that the photosensitive resin layer 3 comes in contact with the transparent substrate 101. The transferred photosensitive layer 4 (conductive layer 2 and photosensitive resin layer 3) is irradiated with active rays of light to form a pattern shape, through a light-shielding mask having a desired shape (first exposure step). After the light-shielding mask has been removed, the support film is peeled, and then the photosensitive layer 4 is irradiated with the active rays of light (second exposure step). The photosensitive resin layer 3 which has been insufficiently cured and also the conductive layer 2 are removed by being subjected to the development after the exposure step, and thereby the cured resin layer 3a and the conductive pattern 2a which is arranged on the cured resin layer 3a are formed (FIG. 8(b)). The transparent electrodes 103a which detect the X position coordinate are formed by the conductive pattern 2a. By forming the transparent electrodes 103 with the above-described method for forming the conductive pattern, it is possible to provide the transparent electrodes 103 in which a step between the conductive pattern 2a and the cured resin layer 3a is small.

Subsequently, the transparent electrodes (Y position coordinate) 104 are formed, as shown in FIG. 8(c). On the transparent substrate 101 provided with the transparent electrodes 103 which have been formed in the above-described step, a new photosensitive conductive film 10 is laminated, and the transparent electrodes 104 which detect the Y position coordinate are formed by a similar operation to the above-described operation (FIG. 8(d)). By forming the transparent electrodes 104 using the photosensitive conductive film 10 of the present embodiment, it is possible to prepare a touch panel sensor in which the formation of a large step and reduction in appearance caused by involvement of air bubbles are sufficiently suppressed and smoothness is high, even when the transparent electrodes 104 are formed on the transparent electrodes 103.

Next, the drawing wires 105 for connecting with an external circuit, and the connection electrodes 106 connecting these drawing wires 105 to the transparent electrodes 103 and 104 are formed on the surface of the transparent substrate 101. In FIG. 8, the representation of the drawing wires 105 and the connection electrodes 106 are omitted, and the drawing wires 105 and the connection electrodes 106 are described so as to be formed after the transparent electrodes 103 and 104 have been formed, but the drawing wires 105 and the connection electrodes 106 may be formed simultaneously when each of the transparent electrodes is formed. The drawing wire 105 can be formed simultaneously with the connection electrode 106, for instance, by using a conductive paste material containing a flake-like silver, with the use of a screen printing method.

EXAMPLES

The present invention will be specifically described below on the basis of examples, but the present invention is not limited to the examples.

<Preparation of Silver Fiber Dispersion Liquid>
[Preparation of Silver Fiber by Polyol Method]

Into a 2000 ml three-neck flask, 500 ml of ethylene glycol was charged, and was heated to 160° C. in an oil bath under a nitrogen atmosphere, while being stirred with a magnetic stirrer. A solution which was obtained by dissolving 2 mg of PtCl$_2$ in 50 ml of ethylene glycol was separately prepared, and was added into the above solution dropwise. After 4 to 5 minutes, a solution which was obtained by dissolving 5 g of AgNO$_3$ in 300 ml of ethylene glycol and a solution which was obtained by dissolving 5 g of polyvinylpyrrolidone (made by Wako Pure Chemical Industries, Ltd.) having a weight average molecular weight of 80000 in 150 ml of ethylene glycol were added dropwise through respective dropping funnels for 1 minute, and then the reaction solution was stirred at 160° C. for 60 minutes.

The above-described reaction solution was left until the temperature became 30° C. or lower, and then the above-described reaction solution was diluted into 10 times with acetone. Centrifugal separation was performed for 20 minutes at 2000 rotations/minute by a centrifuge separator, and the supernatant liquid was decanted. Acetone was added to the precipitate, and then stirring was performed. Subsequently, centrifugal separation was performed on the same condition as the above description, and the acetone was decanted. After that, centrifugal separation was similarly performed twice with the use of distilled water, and the silver fiber was obtained. When the obtained silver fiber was observed with a scanning electron microscope, the fiber diameter (diameter) was approximately 40 nm, and the fiber length was approximately 4 μm.

[Preparation of Silver Fiber Dispersion Liquid]

The silver fiber which was obtained in the above description was dispersed in pure water so that the amount of the silver fiber to be blended was 0.2 mass % and the amount of the pentaethylene glycol dodecyl ether to be blended was 0.1 mass %, and a silver fiber dispersion liquid (conductive dispersion liquid and coating liquid for forming conductive layer) was obtained.

<Formation of Conductive Layer>

The silver fiber dispersion liquid obtained in the above description was uniformly applied onto the support film (polyethylene terephthalate film with thickness of 50 μm, made by Teijin, Ltd., and product name "G2-50") so as to become 20 g/m$^2$, and then drying was performed for 3 minutes in a hot air convection type drier of 100° C. to form the conductive layer (layer which becomes conductive layer of photosensitive conductive film); and thereby a conductive film W1 was obtained. Incidentally, the film thickness of the conductive layer after drying was approximately 0.1 μm. The sheet resistance value of the conductive layer was measured with product made "NC-10" made by NAPSON CORPORATION, and as a result, the sheet resistance value was 150±10Ω/□.

<Preparation of Binder Polymer Solution (A1)>

Materials (1) of A1 shown in Table 1 were charged into a flask which was provided with a stirrer, a reflux cooler, an inert gas introduction port and a thermometer. The temperature was raised to 80° C. under a nitrogen gas atmosphere, and materials (2) of A1 shown in Table 1 were uniformly added dropwise for 4 hours, while the reaction temperature was kept at 80° C.±2° C. After the materials (2) were added dropwise, stirring was continuously performed at 80° C.±2° C. for 6 hours, and the binder polymer solution (50 mass % of solid content) (A1) was obtained which contained the binder polymer (a) having the weight average molecular weight of 45000.

<Preparation of Binder Polymer Solution (A2)>

Materials (1) of A2 shown in Table 1 were charged into a flask which was provided with a stirrer, a reflux cooler, an inert gas introduction port and a thermometer. The temperature was raised to 80° C. under a nitrogen gas atmosphere, and materials (2) of A2 shown in Table 1 were uniformly added dropwise for 4 hours, while the reaction temperature was kept at 80° C.±2° C. After the materials (2) were added dropwise, stirring was continuously performed at 80° C.±2° C. for 6 hours, and the binder polymer solution (50 mass % of solid content) (A2) was obtained which contained the binder polymer having the weight average molecular weight of 50000.

<Preparation of Binder Polymer Solution (A3)>

Materials (1) of A3 shown in Table 1 were charged into a flask which was provided with a stirrer, a reflux cooler, an inert gas introduction port and a thermometer. The temperature was raised to 80° C. under a nitrogen gas atmosphere, and materials (2) of A3 shown in Table 1 were uniformly added dropwise for 4 hours, while the reaction temperature was kept at 80° C.±2° C. After the materials (2) were added dropwise, stirring was continuously performed at 80° C.±2° C. for 6 hours, and the binder polymer solution (50 mass % of solid content) (A3) was obtained which contained the binder polymer having the weight average molecular weight of 50000.

TABLE 1

| | Material | A1 | A2 | A3 |
|---|---|---|---|---|
| (1) | Propylene glycol monomethyl ether | 75 | 75 | 75 |
| | Toluene | 49 | 49 | 49 |
| (2) | Methacrylic acid | 12 | 20 | 12 |
| | Methyl methacrylate | 58 | 50 | 48 |
| | Ethyl acrylate | 20 | 20 | 20 |
| | Styrene | 10 | 10 | 10 |
| | 2-hydroxyethyl methacrylate | — | — | 10 |
| | 2,2'-azo-bis(isobutyronitrile) | 1 | 1 | 1 |

* Each numerical value in Table 1 designates a blended amount (part by mass).

<Measurement of Critical Surface Tension>

Figure 9:
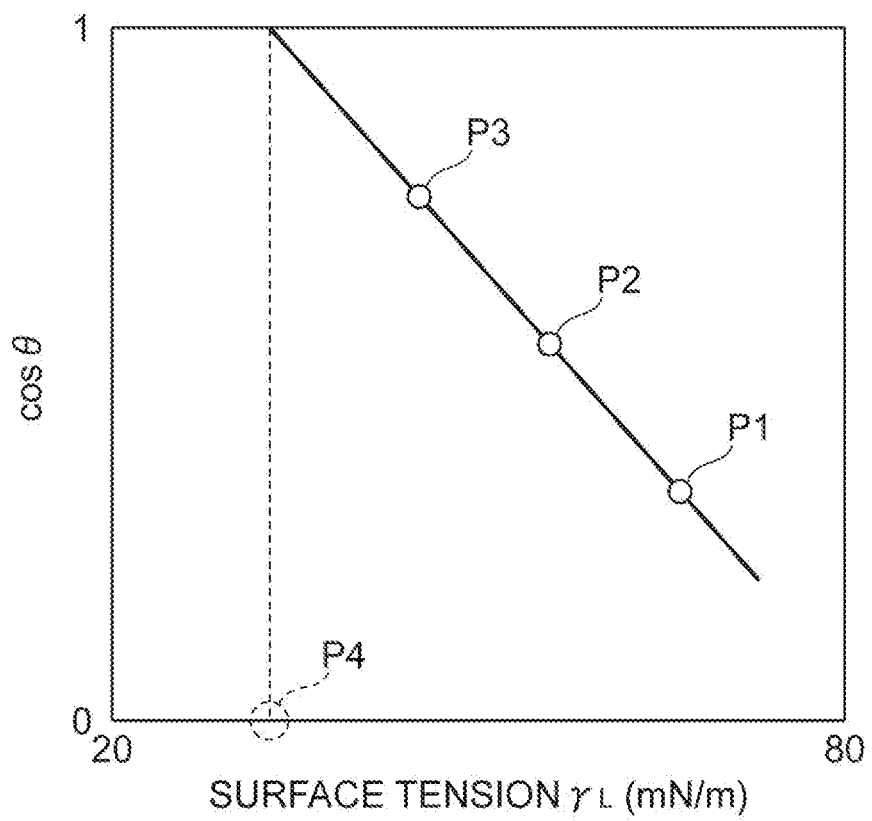
FIG. 9 is a view showing a relationship between a surface tension of a liquid and a cosine of a contact angle.

The binder polymer solution (A1) was diluted by methyl ethyl ketone, and a solution having 40 mass % of the solid content was prepared. The solution having 40 mass % of the solid content of the above-described binder polymer solution (A1) was uniformly applied on a polyethylene terephthalate film (product name "G2-50" with thickness of 50 μm, made by Teijin, Ltd.) with a bar coater, and then drying was performed on a hot plate of 80° C. for 5 minutes; and thereby, a resin film A1 of the binder polymer (a) was formed. Contact angles of water (distilled water made by Wako Pure Chemical Industries, Ltd.), formamide (made by Wako Pure Chemical Industries, Ltd.) and α-bromonaphthalene (made by Wako Pure Chemical Industries, Ltd.) with respect to the resin film A1 were each measured with the use of a contact angle measuring instrument (DropMaster500 made by Kyowa Interface Science Co., Ltd.). As for measurement conditions, a droplet with 1 μL of a liquid amount was added dropwise to the resin film A1, in an external environment of room temperature (25° C.) and humidity of 30 to 50% RH, and the contact angles (θ) after 10 seconds after the dropwise addition were measured. Measurement was performed 10 times on each of various types of liquids, and the average values were determined as the contact angles of the various types of liquids with respect to the resin film A1. A relationship between the surface tension $\gamma_L$ of the liquid and a cosine (cos θ) of the contact angle (θ) was plotted on the basis of the contact angles which had been obtained for the various types of liquids (Zisman plot of FIG. 9). Incidentally, the surface tensions $\gamma_L$, of various types of liquids which were used in the test were each determined to be 72.8 mN/m for water, 58.2 mN/m for formamide and 44.6 mN/m for α-bromonaphthalene. In FIG. 9, P1 is plotted for the water, P2 is plotted for the formamide, and P3 is plotted for the α-bromonaphthalene. Three plotted points were approximated by a straight line; the surface tension corresponding to a point P4 at which the approximation straight line intersects with the line of cos θ=1 was a critical surface tension γc of the resin film A1; and the critical surface tension γc was determined as the critical surface tension of the binder polymer (a). The critical surface tension of the binder polymer (a) was 40.9 mN/m.

The binder polymer solution (A1) and trimethylolpropane triacrylate (TMPTA) which was the component (B) were mixed so that the solid content of the binder polymer (a) was 60 parts by mass, the solid content of TMPTA was 40 parts by mass, and the total was 100 parts by mass. After that, the mixture was diluted by methyl ethyl ketone, and a solution having 40 mass % of the solid content was prepared. The resin film of the mixture of the binder polymer (a) and TMPTA was prepared with a similar method to the above description, and the critical surface tension of the above-described mixture was measured, and as a result, the critical surface tension was 42.6 mN/m.

The critical surface tension of the mixture is a value obtained by multiplying the critical surface tensions of the constitutional components by mass fractions, respectively, and summing the results, and accordingly the following relational expression holds.

Critical surface tension of binder polymer (a)×(60/100)+critical surface tension of TMPTA×(40/100)=42.6 mN/m The critical surface tension of the TMPTA was calculated on the basis that the critical surface tension of the binder polymer (a) was 40.9 mN/m as in the above description, and as a result, the critical surface tension was 45.2 mN/m.

The critical surface tension of the mixture of the binder polymer and the photopolymerizable compound was measured with a similar method to the above description, and according to its measurement result, the critical surface tensions of various types of the photopolymerizable compounds were measured.

<Preparation of Photosensitive Resin Composition Solution>

The materials shown in Table 2 were mixed for 15 minutes with the use of a stirrer, and the photosensitive resin composition solution was prepared.

<Production of Photosensitive Conductive Film>

The photosensitive resin composition solution was uniformly applied onto the conductive film W1 (polyethylene terephthalate film having thickness of 50 μm and having conductive layer formed thereon), and then drying was performed for 10 minutes in a hot air convection type drier of 100° C.; and thereby the photosensitive resin layer was formed. After that, the photosensitive resin layer was covered with a protective film made from polyethylene (polyethylene film, made by TAMAPOLY CO., LTD. and product name "NF-13"), and thereby the photosensitive conductive film was obtained. Incidentally, the film thickness of the photosensitive resin layer after drying was 5 μm.

<Evaluation of Photosensitive Conductive Film>
[Distance Between Surface to be Connected and Conductive Fiber]

In order to examine a distance (average value of the shortest distances) between the surface to be connected (connection surface) and the conductive fiber with a transmission electron microscope, the obtained photosensitive conductive film was irradiated with ultraviolet rays with an exposure amount of 40 mJ/cm$^2$ (measured value at i-line (wavelength of 365 nm)), with the use of a parallel rays exposure machine (product name "EXM1201" made by ORC MANUFACTURING CO., LTD.). Subsequently, irradiation was performed with ultraviolet rays with an energy amount of 1 J/cm$^2$, with the use of an ultraviolet ray irradiation apparatus (product name "QRM-2317-F-00" made by ORC MANUFACTURING CO., LTD.), and thereby a sample for measurement was obtained.

Figure 10:
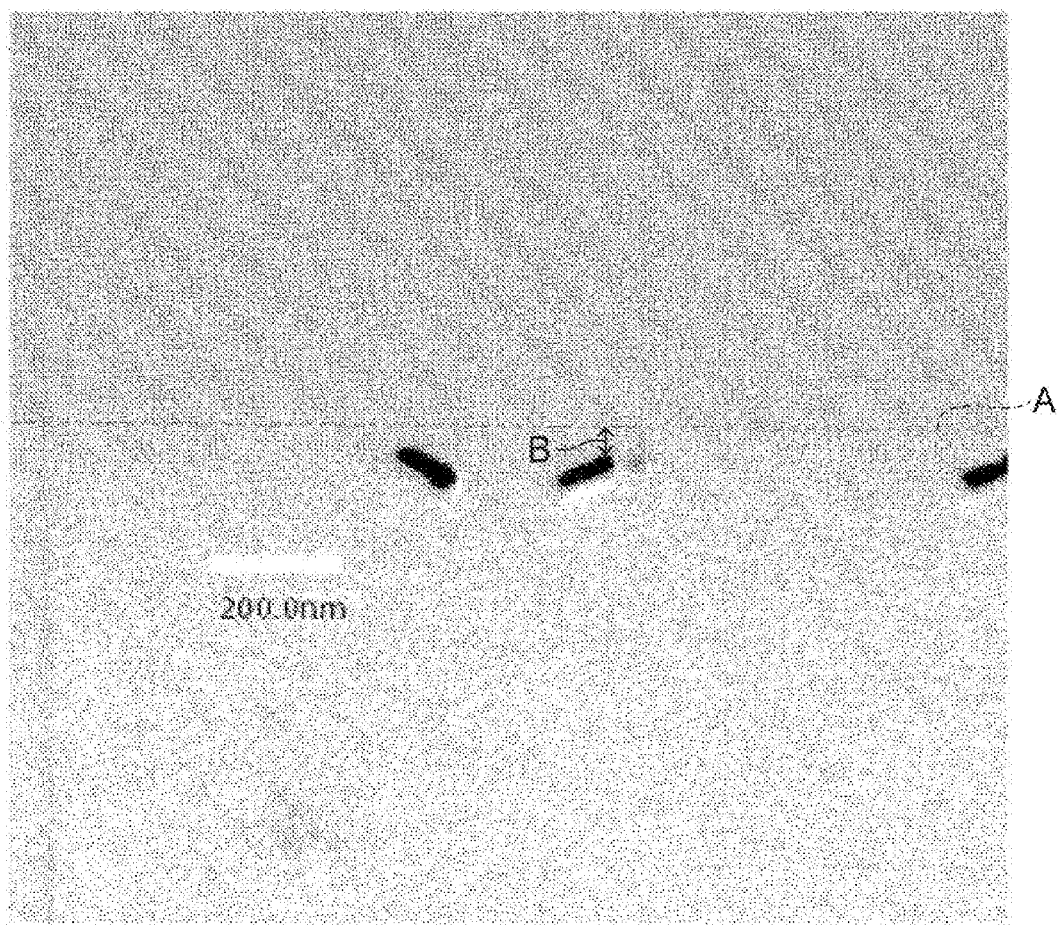
FIG. 10 is a view showing a TEM (transmission electron microscope) photography of a cross section of Example 1.
Figure 11:
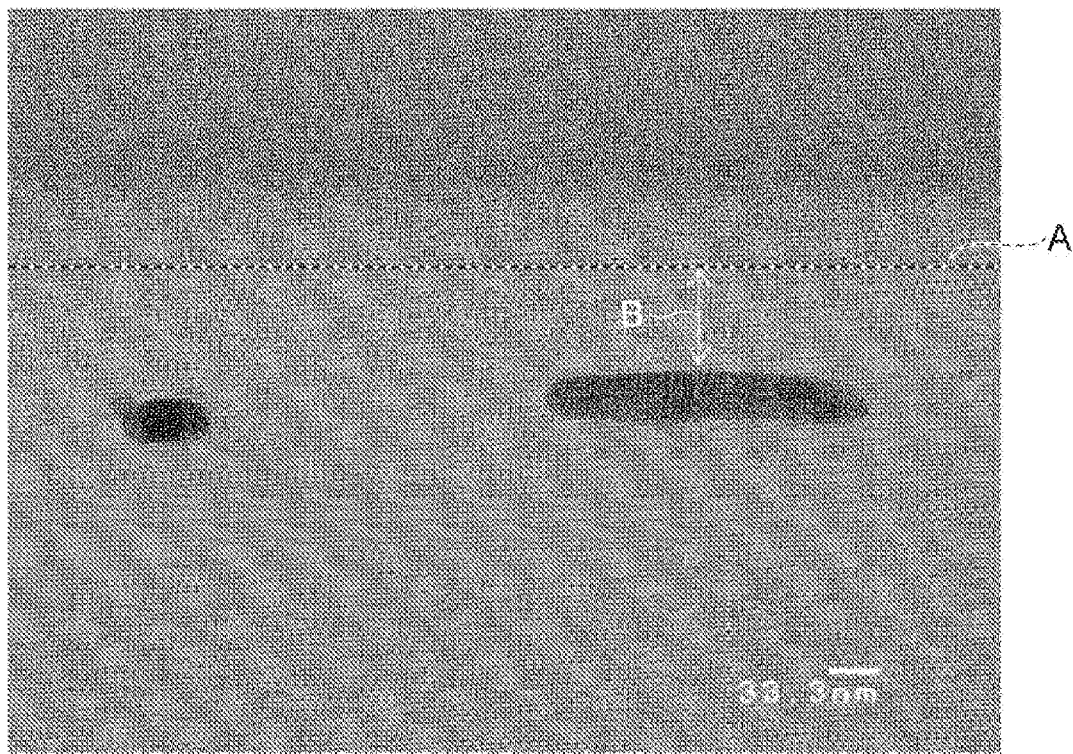
FIG. 11 is a view showing the TEM photography of a cross section of Comparative Example 3.

The obtained sample for measurement was subjected to thin film processing so that the cross section can be observed with a known method (FIB method, microtome method), and then the cross section was observed with the transmission electron microscope. The observation was performed five times (five cross sections) per one sample. The shortest distance between the conductive fiber and the surface to be connected of the photosensitive layer was measured for all of the conductive fibers in an arbitrary range of 500 nm×500 nm, which contains at least one conductive fiber, in an observed range. The average values of the shortest distances which had been measured five times (five cross sections) were determined, and the measured results were shown in Table 2 as "distance (nm) between surface to be connected and conductive fiber". The TEM photograph of the cross section of Example 1 was shown in FIG. 10, and the TEM photograph of the cross section of the Comparative example 3 was shown in FIG. 11. The reference character A in FIG. 10 and FIG. 11 designates the surface of the photosensitive layer. The reference character B in FIG. 10 and FIG. 11 designates the shortest distance between the surface of the photosensitive layer and the conductive fiber.

<Evaluation of Connectivity>

In order to examine the connectivity of the photosensitive conductive film, a sample for evaluating connectivity was obtained in the following way. Firstly, while the polyethylene film of the obtained photosensitive conductive film was peeled, lamination was performed so that the photosensitive resin layer comes in contact with a silicon wafer. After that, irradiation was performed with ultraviolet rays with an exposure amount of 40 mJ/cm$^2$ (measured value at i-line (wavelength of 365 nm)), with the use of a parallel rays exposure machine (product name "EXM1201" made by ORC MANUFACTURING CO., LTD.), and then the support film was peeled to expose the photosensitive layer. Subsequently, irradiation was performed with ultraviolet rays with an energy amount of 1 J/cm$^2$, with the use of an ultraviolet ray irradiation apparatus (product name "QRM-2317-F-00" made by ORC MANUFACTURING CO., LTD.), and thereby a sample for evaluating connectivity was obtained.

On the obtained sample for evaluating the connectivity, aluminum electrodes (circular shape, 2 mm of diameter and 50 nm of thickness) were prepared at intervals of 2 cm, with a resistance heating vacuum deposition method. The aluminum electrodes were vapor-deposited on the surface of the photosensitive layer of the sample for evaluating the connectivity so as to come in contact with the conductive layer. The resistance value between the prepared aluminum electrodes was measured with the use of a pocket tester to evaluate the connectivity. When the resistance value was 200Ω or less, the connectivity was evaluated as "A"; when the resistance value was more than 200Ω and 500Ω or less, the connectivity was evaluated as "B"; and when the resistance value was more than 500Ω, the connectivity was evaluated as "C". The evaluation result of the connectivity was shown in Table 2.

TABLE 2

| Item | | | Example 1 | Example 2 | Example 3 | Example 4 | Example 5 | Example 6 | Example 7 | Example 8 | Example 9 | Comparative example 1 | Comparative example 2 | Comparative example 3 |
|---|---|---|---|---|---|---|---|---|---|---|---|---|---|---|
| Photosensitive resin composition solution | (A) | (A1) | 60 | 60 | 60 | 60 | 60 | 60 | 60 | 60 | 65 | 60 | — | — |
| | | (A2) | — | — | — | — | — | — | — | — | — | — | 60 | — |
| | | (A3) | — | — | — | — | — | — | — | — | — | — | — | 60 |
| | (B) | TMPTA | 40 | — | 40 | 40 | 40 | 40 | 40 | — | 35 | — | — | — |
| | | BPE-500 | — | 40 | — | — | — | — | — | — | — | — | — | — |
| | | BPE-1300N | — | — | — | — | — | — | — | 40 | — | — | — | — |
| | | BPE-100 | — | — | — | — | — | — | — | — | — | 40 | — | — |
| | | PET-30 | — | — | — | — | — | — | — | — | — | — | 40 | 40 |
| | (C) | OXE-01 | 5 | 5 | — | — | — | — | — | 5 | 5 | 5 | 5 | 5 |
| | | DFI-091 | — | — | 5 | — | — | — | — | — | — | — | — | — |
| | | NCI-930 | — | — | — | 5 | — | — | — | — | — | — | — | — |
| | | NCI-831 | — | — | — | — | 5 | — | — | — | — | — | — | — |
| | | TR-PBG-3057 | — | — | — | — | — | 5 | — | — | — | — | — | — |
| | | N-1919 | — | — | — | — | — | — | 5 | — | — | — | — | — |
| | Others | SH-30 | 0.1 | 0.1 | 0.1 | 0.1 | 0.1 | 0.1 | 0.1 | 0.1 | 0.1 | 0.1 | 0.1 | 0.1 |
| | | Methyl ethyl ketone | 50 | 50 | 50 | 50 | 50 | 50 | 50 | 50 | 50 | 50 | 50 | 50 |
| Evaluation result | | Distance between surface to be connected and conductive fiber (nm) | 45 | 32 | 44 | 49 | 46 | 47 | 46 | 12 | 41 | 70 | 80 | 85 |
| | | Evaluation of connectivity | A | A | A | B | B | B | B | A | A | C | C | C |

* Each numerical value in Table 2 designates the blended amount (parts by mass). The amount of the binder polymer solution to be blended is an amount of the solid content to be blended.

The details of the components shown in Table 2 are described below.

TMPTA: Trimethylolpropane triacrylate (critical surface tension: 45.2 mN/m, hydroxyl value: 0 mgKOH/g, made by Nippon Kayaku Co., Ltd.)

BPE-500: Ethoxylated bisphenol-A dimethacrylate (2,2-bis(4-(methacryloxy-pentaethoxy)phenyl)propane, critical surface tension: 44.8 mN/m, hydroxyl value: 0 mgKOH/g, 10 mol of EO where EO is ethylene oxide, made by Shin-Nakamura Chemical Co., Ltd.)

BPE-1300N: Ethoxylated bisphenol-A dimethacrylate (2,2-bis(4-(methacryloxy-pentadecaethoxy)phenyl)propane, critical surface tension: 39.3 mN/m, hydroxyl value: 0 mgKOH/g, 30 mol of EO, made by Shin-Nakamura Chemical Co., Ltd.)

BPE-100: Ethoxylated bisphenol-A dimethacrylate (critical surface tension: 49.3 mN/m, hydroxyl value: 0 mgKOH/g, 2.6 mol of EO, made by Shin-Nakamura Chemical Co., Ltd.)

PET-30: Pentaerythritol triacrylate (critical surface tension: 47.6 mN/m, hydroxyl value: 110 mgKOH/g, made by Nippon Kayaku Co., Ltd.)

OXE-01: 1-[(4-phenylthio)phenyl]-1,2-octanedione 2-(O-benzoyloxime) (made by BASF)

DFI-091: compound represented by the above formula (2-1) (made by Daito Chemix, Corporation.)

NCI-930: compound represented by the above formula (1-1) (Adeka ARKLS NCI-930, product name made by ADEKA CORPORATION)

NCI-831: compound represented by the following formula (Adeka ARKLS NCI-831, product name made by ADEKA CORPORATION)

[Formula 7]

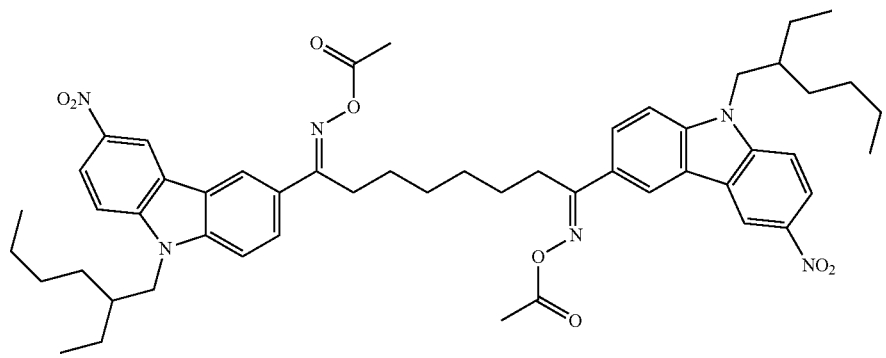

TR-PBG-3057: compound represented by the following formula (made by Changzhou Tronly New Electronic Materials CO., LTD)

[Formula 8]

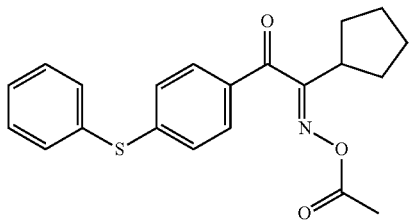

N-1919: compound represented by the above formula (3-1) (Adeka Optomer N-1919, product name made by ADEKA CORPORATION)

SH-30: Octamethylcyclotetrasiloxane (made by Dow Corning Toray Co., Ltd.)

Methyl ethyl ketone: made by Tonen Chemical Corporation

As shown in Table 2, each of the examples showed adequate connectivity, because the average value of the shortest distances between each of the conductive fibers and the surface at the side of the support film of the photosensitive layer is 0.1 to 50 nm.

On the other hand, as shown in Table 2, in the comparative examples, it was confirmed that the conductive fiber crawled into the photosensitive resin layer by using a binder polymer having many polar groups, which is obtained by using a large number of methacrylic acid or 2-hydroxyl methacrylate monomers. In addition, in the comparative examples, the average value of the shortest distances between each of the conductive fibers and the surface at the side of the support film of the photosensitive layer exceeded 50 nm, and the connection was not secured.

INDUSTRIAL APPLICABILITY

The photosensitive conductive film of the present invention can be used in: a flat panel display such as a liquid crystal display element and an organic EL display element; a touch screen; a solar battery; and the like.

REFERENCE SIGNS LIST

1 . . . support film, 2 . . . conductive layer, 2a . . . conductive pattern, 3 . . . photosensitive resin layer, 3a . . . cured resin layer, 4 . . . photosensitive layer, 5 . . . mask pattern, 10 . . . photosensitive conductive film, 20 . . . substrate, 30a and 30b . . . conductive pattern substrate, 101 . . . transparent substrate, 102 . . . touch screen, 103 . . . transparent electrode (X position coordinate), 104 . . . transparent electrode (Y position coordinate), 105 . . . drawing wire, 106 . . . connection electrode, 107 . . . connection terminal, A . . . surface of photosensitive layer, B . . . shortest distance between surface of photosensitive layer and conductive fibers, L . . . active rays of light.

The invention claimed is:

1. A photosensitive conductive film, comprising:
a support film; and
a photosensitive layer provided on the support film, wherein
the photosensitive layer contains a plurality of conductive fibers, and
an average value of shortest distances between each of the conductive fibers and a surface at the side of the support film of the photosensitive layer is 0.1 to 50 nm.

2. The photosensitive conductive film according to claim 1, wherein the conductive fiber is a silver fiber.

3. The photosensitive conductive film according to claim 1, wherein a fiber diameter of the conductive fiber is 1 to 50 nm.

4. The photosensitive conductive film according to claim 1, wherein a fiber length of the conductive fiber is 1 to 100 μm.

5. The photosensitive conductive film according to claim 1, wherein
the photosensitive layer contains a photopolymerizable compound having an ethylenically unsaturated bond, and
a hydroxyl value of the photopolymerizable compound is 90 mgKOH/g or less.

6. The photosensitive conductive film according to claim 1, wherein
the photosensitive layer contains a photopolymerizable compound having an ethylenically unsaturated bond, and
a critical surface tension of the photopolymerizable compound is 47 mN/m or less.

7. The photosensitive conductive film according to claim 1, wherein the photosensitive layer contains at least one selected from the group consisting of trimethylolpropane tri(meth)acrylate, ethylene oxide-containing trimethylolpropane tri(meth)acrylate, propylene oxide-containing trimethylolpropane tri(meth)acrylate, ditrimethylolpropane tetra(meth)acrylate and dipentaerythritol hexa(meth)acrylate.

8. The photosensitive conductive film according to claim 7, wherein the photosensitive layer contains trimethylolpropane tri(meth)acrylate.

* * * * *